United States Patent [19]

Reeve et al.

[11] Patent Number: 5,781,600
[45] Date of Patent: Jul. 14, 1998

[54] FREQUENCY SYNTHESIZER

[75] Inventors: John Michael Reeve, Hitchin; John Norman Wells, St. Albans, both of United Kingdom

[73] Assignee: Marconi Instruments Limited, United Kingdom

[21] Appl. No.: 546,555

[22] Filed: Oct. 20, 1995

[30]       Foreign Application Priority Data

Oct. 28, 1994 [GB] United Kingdom .................. 9421841

[51] Int. Cl.$^6$ ..................................................... H03D 3/24
[52] U.S. Cl. ............................ 375/376; 327/157; 331/25
[58] Field of Search ............................. 375/376, 327, 375/294; 455/260; 331/18, 25; 327/105, 113, 117, 119, 147, 156

[56]              References Cited

U.S. PATENT DOCUMENTS

| | | | |
|---|---|---|---|
| 2,648,006 | 8/1953 | Mabry | 327/105 |
| 3,694,766 | 9/1972 | Boelke | 331/25 |
| 5,150,078 | 9/1992 | Yang et al. | 331/2 |
| 5,259,007 | 11/1993 | Yamamoto | 375/376 |
| 5,281,903 | 1/1994 | Taromaru et al. | 331/127 |
| 5,343,168 | 8/1994 | Guthrie | 331/18 |

Primary Examiner—Stephen Chin
Assistant Examiner—Betsy L. Deppe
Attorney, Agent, or Firm—Spencer & Frank

[57]            ABSTRACT

A frequency synthesizer for producing a tunable frequency output signal. The synthesizer includes a tunable frequency oscillator having a tunable output signal and including: a voltage controlled oscillator (VCO) for generating an output signal; a harmonic generator coupled to the VCO for generating a plurality of harmonics of the VCO output signal; and a tunable bandpass filter coupled to the harmonic generator and having an output for selectively passing any one of the VCO output signal harmonics which constitutes both the tunable output signal of the tunable frequency oscillator and the tunable frequency output signal of the frequency synthesizer. The synthesizer further includes a variable device coupled to the tunable bandpass filter for reducing a frequency of the tunable output signal of the tunable frequency oscillator for generating a reduced frequency output signal; and a phase detector coupled to the variable device for producing an error signal in dependence of a comparison between the reduced frequency output signal and a predetermined reference signal, the phase detector further being coupled to the VCO of the tunable frequency oscillator for creating a phase locked loop for controlling the VCO output signal based on the error signal.

7 Claims, 2 Drawing Sheets

FREQUENCY SYNTHESIZER

FIELD OF THE INVENTION

This invention relates to a frequency synthesiser.

BACKGROUND OF THE INVENTION

For the implementation of communication systems and associated test equipment, it is necessary to generate high frequency signals. In practice the effect of inherent noise produces unwanted residual phase modulation of the high frequency signal. The effect of this is to limit the dynamic range of a communication system and to degrade the bit error rate. It is therefore an advantage to minimize the amount of residual phase noise.

FIG. 1 shows a typical frequency synthesiser for generating a broad spectrum of radio frequency signals. A high frequency signal output by a high frequency voltage controlled oscillator (VCO) 1 is divided by a frequency divider 3 to provide a low frequency signal. This signal is passed to a phase detector 5 where it is compared in phase to a stable, low frequency, low noise reference provided by source 7. The resulting error signal is used to control high frequency VCO 1. The frequency output by VCO 1 is controlled by altering the division ratio N of divider 3. Providing VCO 1 covers an octave range, then a continuous spectrum of low frequency signals may be generated by successive division by two of the output of the synthesiser at 9. For example, if the octave range covered by VCO 1 is 1200–2400 MHz, then division of this range by two gives the lower frequency range 600–1200 MHz, and division by two of the range 600–1200 MHz gives the lower range 300–600 MHz, etc.

A problem with the synthesiser of FIG. 1 is producing high frequency VCO 1 with sufficiently low residual phase noise. The noise of an oscillator is determined by: the loss in its resonator; the noise inevitably introduced by the oscillator transistor and its associated components; and the noise introduced by the conversion of amplitude modulation to phase modulation in the operation of the VCO tuning diodes. At high frequencies the noise contributed by resonator loss increases due to skin effect losses in the resonator conductors, dielectric losses in the resonator capacitors, and losses in the resonator tuning diodes. Further, the noise contributed by the transistor increases at high frequencies.

The noise introduced by the resonator loss and by the amplitude to phase modulation conversion may be reduced by replacing VCO 1 of FIG. 1 by a series of narrow band oscillators, the narrow bands together covering the range of frequencies covered by VCO 1. A narrow band oscillator of the series is switched into the phase locked loop of FIG. 1 when it is required that the frequency synthesiser generate a frequency within the narrow band of that oscillator. A penalty of using a series of narrow band oscillators is increased complexity and cost.

It is accepted in the art that if a signal of frequency f has phase noise sidebands that are 6 dB greater in magnitude than a signal of frequency f/2, then the two signals are equivalently noisy. The figure of 6 dB comes from a consideration of the multiplication by n of a frequency in a manner that adds no phase noise itself. The phase noise sidebands in the signal after multiplication will be 20 log10(n) dB or 6 dB/octave greater than they were prior to multiplication. Many present day high frequency oscillators have noise that is worse than 6 dB greater than oscillators designed to operate at half the frequency due to the aforementioned noise problems.

FIG. 2 shows a common alternative architecture to that shown in FIG. 1. The architecture is principally the same as that of FIG. 1 (like parts labelled with the same reference numerals), but with the addition of a frequency doubler 11 and switched bandpass filters 13. VCO 1 is designed to operate at half the frequency with a consequent improvement in phase noise. Doubler 11 doubles the frequency, and an appropriate filter of the switched filters 13 is selected to pass the double frequency and stop leakage and unwanted harmonics of the frequency generated by VCO 1. A disadvantage with the synthesiser of FIG. 2 is that an impracticably fine level of filtering is required to remove phase noise added by the doubling stage.

SUMMARY OF THE INVENTION

An object of the present invention is to provide a frequency synthesizer with low phase noise relative to frequency synthesizers of the prior art.

The above object is fulfilled by the instant invention, which pertains to a frequency synthesizer for producing a tunable frequency output signal, comprising a tunable frequency oscillator having a tunable output signal and including: a voltage controlled oscillator (VCO) for generating an output signal; a harmonic generator coupled to the VCO for generating a plurality of harmonics of the VCO output signal; and a tunable bandpass filter coupled to the harmonic generator and having an output for selectively passing any one of the VCO output signal harmonics which constitutes both the tunable output signal of the tunable frequency oscillator and the tunable frequency output signal of the frequency synthesizer. The synthesizer further includes a variable device coupled to the tunable bandpass filter for reducing a frequency of the tunable output signal of the tunable frequency oscillator for generating a reduced frequency output signal; and a phase detector coupled to the variable device for producing an error signal in dependence of a comparison between the reduced frequency output signal and a predetermined reference signal, the phase detector further being coupled to the VCO of the tunable frequency oscillator for creating a phase locked loop for controlling the VCO output signal based on the error signal.

BRIEF DESCRIPTION OF THE DRAWINGS

A frequency synthesiser in accordance with the present invention will now be described, by way of example, with reference to the accompanying drawings, in which.

DETAILED DESCRIPTION OF THE INVENTION

Figure 1:
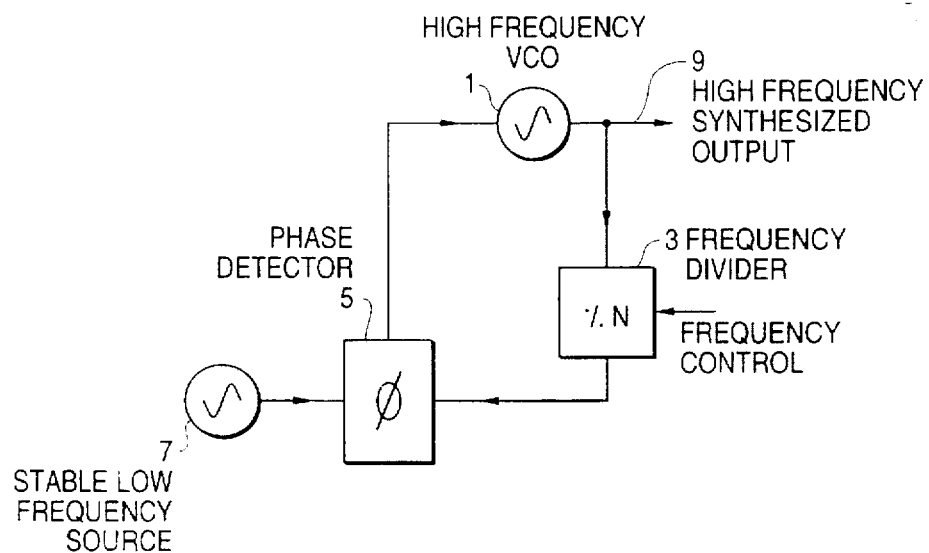
FIGS. 1 and 2, already referred to, are block schematic diagrams of known synthesisers.
Figure 2:
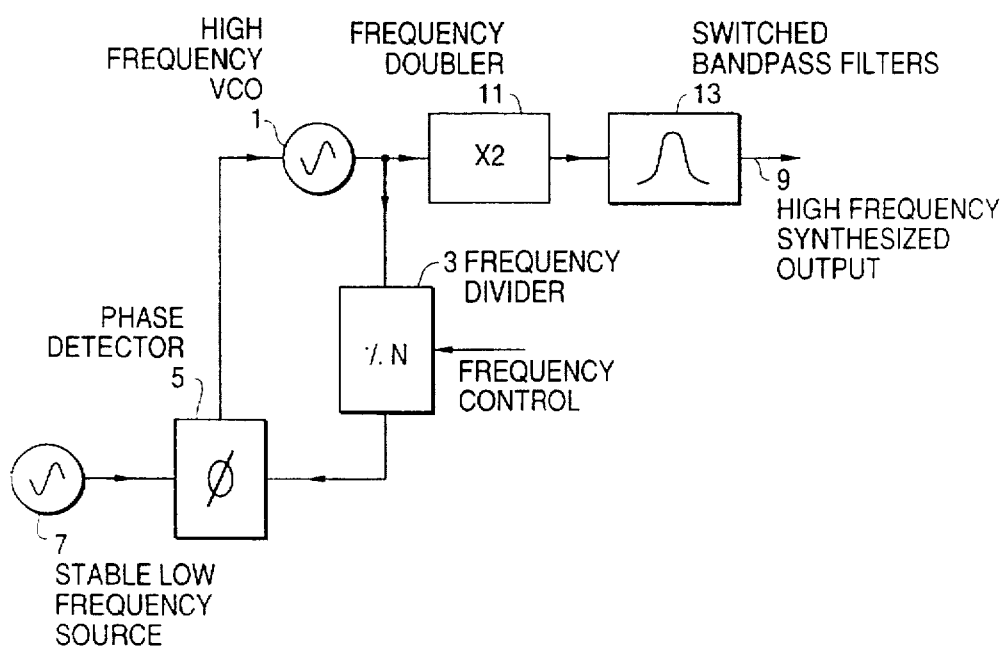
Figure 3:
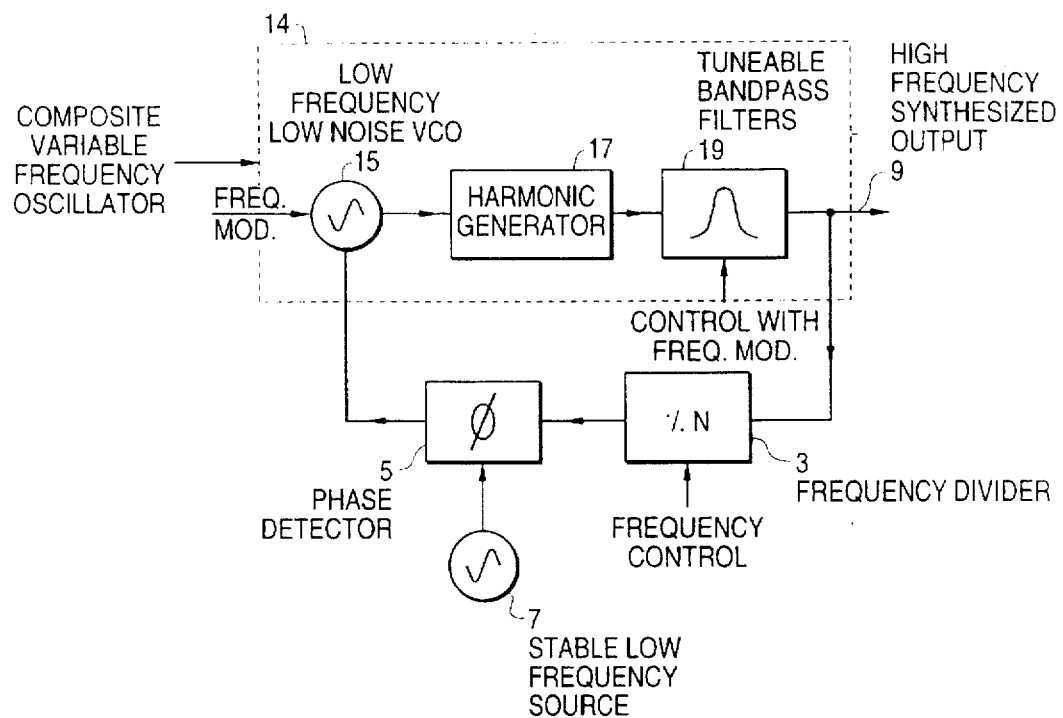
FIG. 3 is a block schematic diagram of the synthesiser according to the invention.

In the figures, like parts are labelled with the same reference numerals. Referring first to FIG. 3, the high frequency VCO 1 of FIGS. 1 and 2 is replaced by a composite variable frequency oscillator 14 comprising a lower frequency low noise VCO 15, a harmonic generator 17, and a voltage tuned bandpass filter 19 with an octave tuning range. Harmonic generator 17 produces a comb of frequencies at multiples of the frequency of VCO 15, i.e. generator 17 outputs the frequency of VCO 15 and harmonics thereof all with approximately the same amplitude (the amplitude of each harmonic is less than a 20 dB drop from the amplitude of the component at the frequency of VCO 15). One harmonic is selected as the desired synthesiser output frequency by tuned bandpass filter 19.

If, for example, a 1.2–2.4 GHz synthesiser is required, then, as will now be explained, this may be achieved by VCO 15 having a tuning range of 400–533.33 MHz. For the synthesiser to output frequencies in the range 1.2–1.6 GHz, the harmonic 3x the frequency of VCO 15 is selected by filter 19, and it is necessary that the full 400–533.33 MHz range of VCO 15 be utilised. For the synthesiser to output frequencies in the range 1.6–2.0 GHz, the harmonic 4x is selected, and it is necessary that the range 400–500 MHz of the full 400–533.33 MHz range of VCO 15 be utilised. For the synthesiser to output 2.0–2.4 GHz, the harmonic 5x is selected, and it is necessary that 400–480 MHz of the 400–533.33 MHz range be used. Thus, it will be seen that the desired 1.2–2.4 GHz range for the synthesiser has been achieved.

The tuning range of VCO 15 is both low (covers frequencies 400–533.33 MHz) and narrow (is appreciably less than half an octave) compared to the range of frequencies generated by the synthesiser (covers frequencies 1.2–2.4 GHz and is one octave in extent). The above arrangement alleviates the aforementioned phase noise problems. Further, it is easier to design the synthesiser of FIG. 3 to have a linear tuning characteristic due to the narrow tuning range of VCO 15. Bandpass filter 19 must pass the desired output frequency whilst rejecting the adjacent harmonics 400–533.33 MHz away. The use of a frequency range lower than 400–533.33 MHz for VCO 15 and the selection of higher harmonic multiples by filter 19 achieves even better noise performance, but requires filter 19 to reject adjacent harmonics closer to the desired output, making filter 19 more complicated.

The output of filter 19 is phase locked. Thus, any phase noise added by harmonic generator 17 and filter 19 will be removed by the phase locked loop, providing it is within the loop bandwidth.

A frequency modulated output of the synthesiser of FIG. 3 may be achieved by modulation of the frequency output by VCO 15. In the aforegiven example of a 1.2–2.4 GHz synthesiser, to obtain a 100 KHz deviation at an output frequency of 1.8 GHz, VCO 15 need only deviate by 25 KHz since it is then multiplied by four. By reducing the deviation required, distortion due to non-linearity in the tuning characteristic of the synthesiser is reduced. For large deviations it may be necessary to vary the centre frequency of bandpass filter 19 in sympathy with the frequency modulation.

Figure 4:
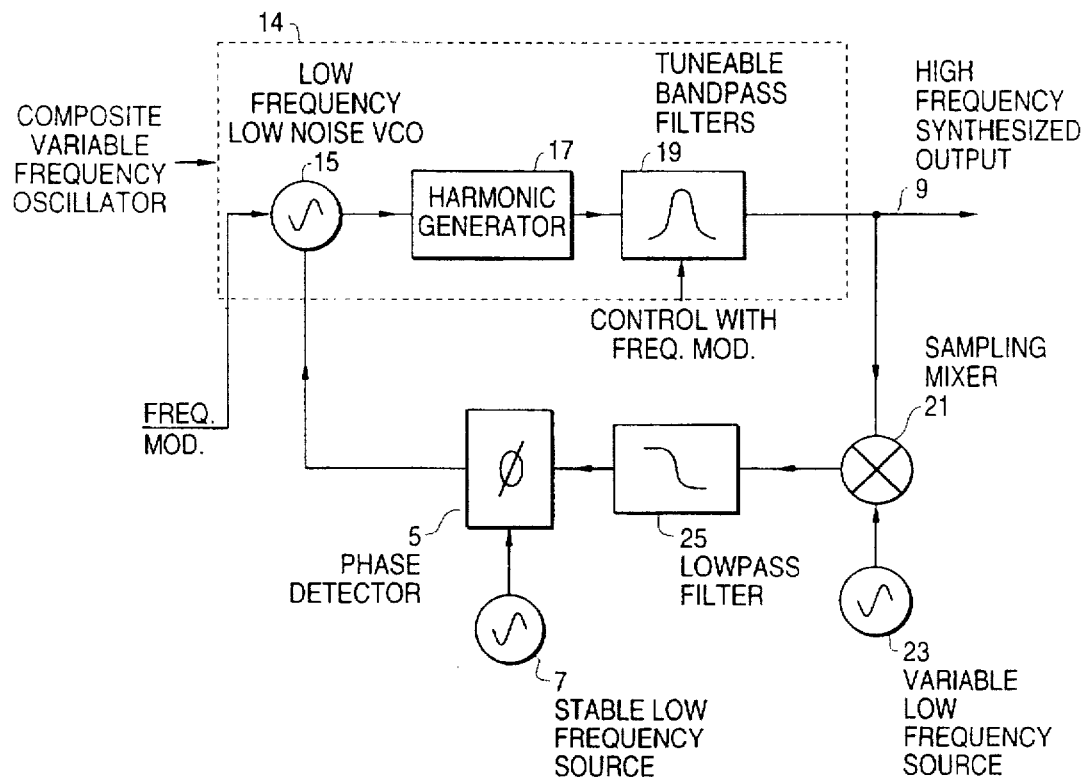
FIG. 4 illustrates a modification of the synthesiser of FIG. 3.

In FIG. 4, like circuit parts to those of FIGS. 1, 2 and 3 are labelled with the same reference numerals.

Referring to FIG. 4, the architecture is the same as that of FIG. 3 except frequency divider 3 is replaced by sampling mixer 21, variable low frequency source 23, and lowpass filter 25. The reduced frequency at the input to phase detector 5 is achieved by appropriately setting source 23. Lowpass filter 25 passes the wanted subtraction of the outputs of filter 19 and source 23, and stops the unwanted addition of these outputs.

As further shown schematically in FIGS. 3 and 4, the VCO may have a modulated frequency, and, in addition, the synthesizer may include a means for varying a center frequency of the tunable bandpass filter in sympathy with a modulation of the VCO output signal.

What is claimed is:

1. A frequency synthesizer for producing a tunable frequency output signal, comprising:

a tunable frequency oscillator having a tunable output signal and including:

a voltage controlled oscillator (VCO) for generating an output signal;

a harmonic generator coupled to the VCO for generating a comb of harmonic frequencies of the VCO output signal, each harmonic frequency having substantially the same amplitude; and a tunable bandpass filter means coupled to the harmonic generator and having an output for selectively passing any one of the VCO output signal harmonics which constitutes both the tunable output signal of the tunable frequency oscillator and the tunable frequency output signal of the frequency synthesizer;

variable means coupled to the tunable bandpass filter means for reducing a frequency of the tunable output signal of the tunable frequency oscillator for generating a reduced frequency output signal; and a phase detector means coupled to the variable means for producing an error signal in dependence of a comparison between the reduced frequency output signal and a predetermined reference signal, the phase detector means further being coupled to the VCO for creating a phase locked loop for controlling the VCO output signal based on the error signal.

2. The frequency synthesizer according to claim 1, wherein the variable means comprises a frequency divider.

3. The frequency synthesizer according to claim 1, wherein the variable means comprises:

a variable frequency source for generating a variable frequency output signal;

a mixer having inputs coupled, respectively, to the variable frequency source and the tunable frequency oscillator for mixing the variable frequency output signal with the tunable output signal of the tunable frequency oscillator for producing a mixer output signal comprising a subtraction and an addition of the signals at the mixer inputs; and a lowpass filter coupled to the mixer for passing the subtraction of the mixer input signals and for stopping the addition of the mixer input signals.

4. The frequency synthesizer according to claim 1, wherein the VCO output signal has a modulated frequency.

5. The frequency synthesizer according to claim 4, further comprising means for varying a center frequency of the tunable bandpass filter means in sympathy with a modulation of the frequency of the VCO output signal.

6. The frequency synthesizer according to claim 1, wherein:

the VCO generates an output signal having a frequency in a range of 400–533.33 MHz;

the harmonic generator generates a comb of harmonic frequencies including signals having frequencies which are three times, four times and five times the frequency of the VCO output signal, respectively, whereby:

the output signal of the frequency synthesizer has frequencies in a range of 1200–1600 MHz when the VCO is tuned to generate an output signal having a frequency in the range of 400–533.3 MHz and the tunable bandpass filter means selects a harmonic having a frequency which is three times the frequency of the VCO output signal;

the output of the frequency synthesizer has frequencies in a range of 1600–2000 MHz when the VCO is tuned to generate an output signal having a frequency in a range of 400–500 MHz and the tunable bandpass filter means selects a harmonic having a frequency which is four times the frequency of the VCO output signal; and the output of the frequency synthesizer has frequencies in a range of 2000–2400 MHz when the VCO is tuned to generate an output signal having a frequency in a range of 400–480 MHz and when the tunable bandpass filter means selects a harmonic having a frequency which is five times the frequency of the VCO output signal.

7. A method of using the frequency synthesizer of claim 1, comprising the steps of:

synthesizing a first range of frequencies by tuning the tunable bandpass filter means to select a first harmonic of the comb of harmonic frequencies; and synthesizing at least one further range of frequencies by tuning the tunable bandpass filter means to select at least one further harmonic of the comb of harmonic frequencies.

* * * * *